United States Patent

Nash et al.

[11] Patent Number: 5,983,116
[45] Date of Patent: Nov. 9, 1999

[54] RADIO TELEPHONE HAVING ANALOG KEY SIGNAL OUTPUT FOR POWER CONSERVATION

[75] Inventors: Adrian Philip Nash, Camberley; Richard Martin Stephens, Chichester, both of United Kingdom

[73] Assignee: Nokia Mobile Phones Limited, Espoo, Finland

[21] Appl. No.: 08/505,086

[22] Filed: Jul. 21, 1995

[30] Foreign Application Priority Data

Jul. 26, 1994 [GB] United Kingdom ............ 9415066

[51] Int. Cl.[6] .................. H04B 1/38; H03K 17/94; H04M 1/00
[52] U.S. Cl. .................. 455/550; 455/574; 341/26; 379/368
[58] Field of Search ............... 455/550, 574, 455/575; 379/419, 429, 433, 253, 368; 341/20–26; 340/825.79; 364/709.01, 709.12

[56] References Cited

U.S. PATENT DOCUMENTS

| | | | |
|---|---|---|---|
| 4,463,221 | 7/1984 | Soulliard et al. | 455/550 |
| 4,467,140 | 8/1984 | Fathauer et al. | 455/462 |
| 4,616,213 | 10/1986 | Danish | 341/21 |
| 4,725,816 | 2/1988 | Petterson | 340/365 S |
| 4,772,874 | 9/1988 | Hasegawa | 341/26 |
| 4,918,634 | 4/1990 | Nishimori | 364/709.12 |
| 5,057,699 | 10/1991 | Spence | 307/98 |
| 5,235,636 | 8/1993 | Takagi et al. | 379/368 |
| 5,521,575 | 5/1996 | Pack | 341/26 |
| 5,534,860 | 7/1996 | Phillips et al. | 341/26 |
| 5,619,196 | 4/1997 | Escobosa | 341/22 |
| 5,621,402 | 4/1997 | Spak et al. | 341/26 |
| 5,719,597 | 2/1998 | Fong | 341/26 |

FOREIGN PATENT DOCUMENTS

| | | |
|---|---|---|
| 0134853 | 3/1985 | European Pat. Off. . |
| 3312153 | 10/1984 | Germany . |
| 1569149 | 6/1980 | United Kingdom . |
| 2051519 | 1/1981 | United Kingdom . |

*Primary Examiner*—Dwayne D. Bost
*Assistant Examiner*—Tracy M. Legree
*Attorney, Agent, or Firm*—Perman & Green, LLP

[57] ABSTRACT

A radio telephone has an array of manually operable switches mounted on a respective support. A processing circuit processes signals received via said switches and said support supplies signals to said processing device over a single transmission line. The processing device is arranged to determine an analogue characteristic of a signal received from the support via said transmission line in order to determine which of said manually operable keys has been manually operated. An analogue-to-digital converter can be used to measure voltage values identifying key selection or a timer can be used to measure capacitor charging or discharging.

20 Claims, 5 Drawing Sheets

RADIO TELEPHONE HAVING ANALOG KEY SIGNAL OUTPUT FOR POWER CONSERVATION

BACKGROUND OF THE INVENTION

The present invention relates to a radio telephone having an array of manually operable buttons.

Keypads are known for supplying digital codes to processing equipment, such as mobile cellular telephones, in response to manual operation by a user. In order to convey digital codes to a processing device within the telephone, it is known to perform digital scanning in which, for an N×M switching matrix, a set of outputs energise each of N rows of switches in turn. For each energised row of switches, the columns are read as an M-bit word. Logic and associated software determine which row was energised when a column produces an active signal, therefore the active key which has been manually pressed can be identified from a word of M+N bits.

A disadvantage of this known technique is that for an N×M keypad, N outputs from, and M inputs to an input/output (I/O) device are required. Furthermore, the N outputs must be driven in sequence continually at a sufficiently high rate. Thus, N output buffers dissipate power most of the time. In addition, a software routine or logic circuit must be run in conjunction with the scan lines to decode the column information. These operations dissipate power which, in some applications, do not create a problem. However, in a mobile phone a major consideration is the rate at which the phone dissipates its local power supply. Thus, a problem with the known digital scan technique is that it may require power to be dissipated while the telephone is in its stand-by condition.

A further problem with the known digital scanning technique is that N+M connections are required between the I/O device and the keypad. In modern mobile phones, it is desirable to include as much processing power as possible within an application specific integrated circuit, so as to minimise assembly costs. Although it is possible to construct integrated circuits with a significant number of pins, 144 or 176 pins for example, it is desirable to minimise the pin count. Furthermore, the keypad itself may be mounted on a separate circuit board, commonly of a flexible type and the connection point between the main board and the keypad is vulnerable to breakage and dry jointing etc. Consequently, it is preferable to minimise the number of connections between the keypad and the main board. In addition a main board usually requires filtering components on each connection which, even in surface mount can occupy a large amount of board space and adds cost.

SUMMARY OF THE INVENTION

In accordance with the invention, there is provided a mobile telephone having an array of manually operable selection means; means for supporting said manually operable selection means including electrical connection means arranged to make electrical contact when respective selection means are selected; processing means; a transmission line connecting said electrical connection means to said processing means; wherein said processing means is arranged to determine an analogue characteristic on a signal received from said connection means via said transmission line in order to determine which of said manually operable selection means has been manually operated.

BRIEF DESCRIPTION OF THE DRAWINGS

Embodiments of the invention will now be described by way of example only, with reference to the accompanying figures, in which.

DETAILED DESCRIPTION OF THE INVENTION

Figure 1:
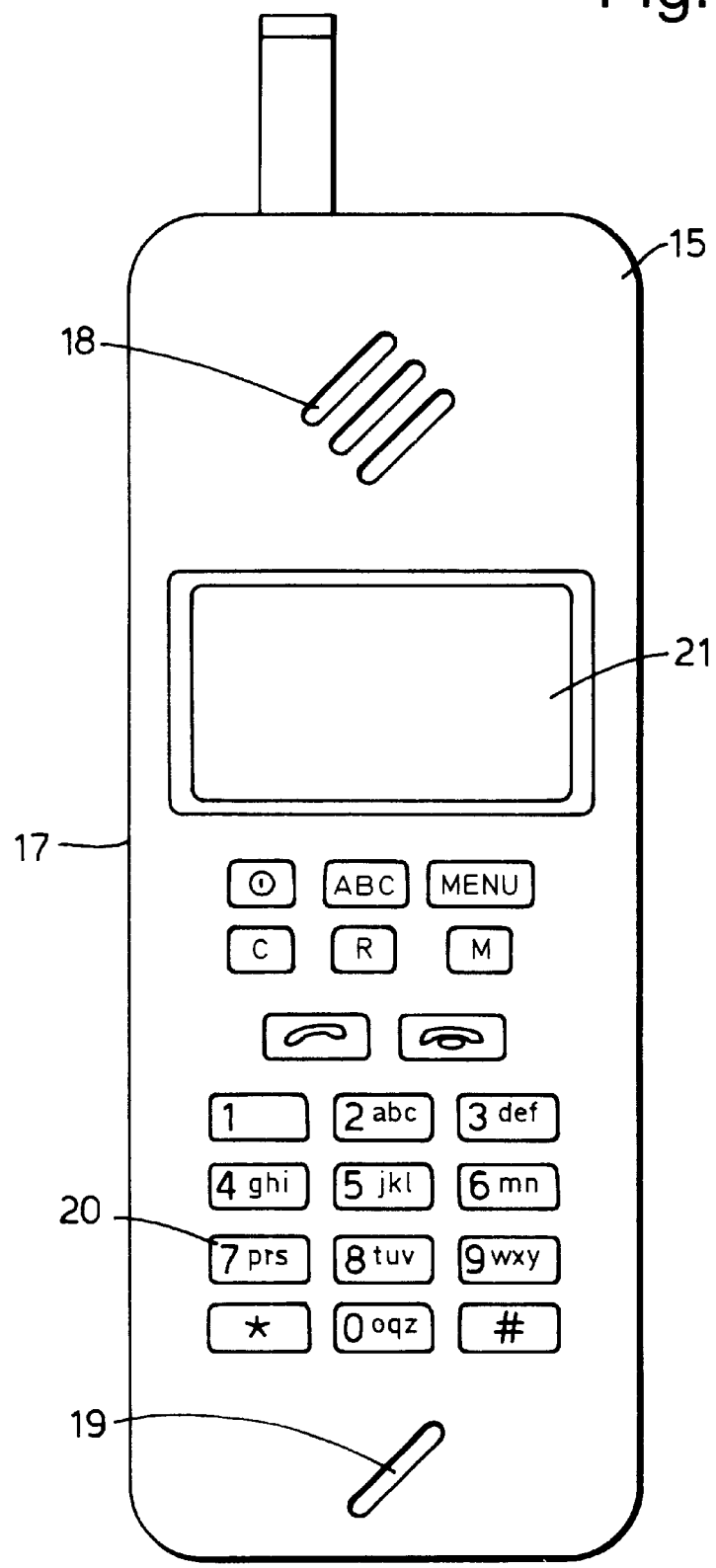
FIG. 1 shows a cellular telephone housing.

A portable cellular telephone housing is shown in FIG. 1, having a front face 15, a first side face 16 and a second side face 17. The front face 15 includes openings 18 behind which a loudspeaker is mounted and an opening 19 behind which a microphone is mounted, thereby allowing the front face of the telephone to be brought into operating proximity with the mouth and an ear of a user.

Keys 20 are provided on the front face 15 which are arranged so as to present a plurality of keys in the form of keypad to an operator. The keys are used for entering alpha numeric data and for selecting particular operating functions. The keys are arranged such that they can be operated by an operator's finger which, in normal operation, would result in a single key being pressed. However, mobile cellular telephones are being made smaller and smaller, therefore there is a tendency for the keypad to be arranged with less space between adjacent keys. Thus, it is possible for adjacent keys to be erroneously pressed simultaneously and it is desirable for the telephone to detect the difference between individual key presses, which can be acted upon as desired, and an erroneous depression of two adjacent keys.

Figure 2:
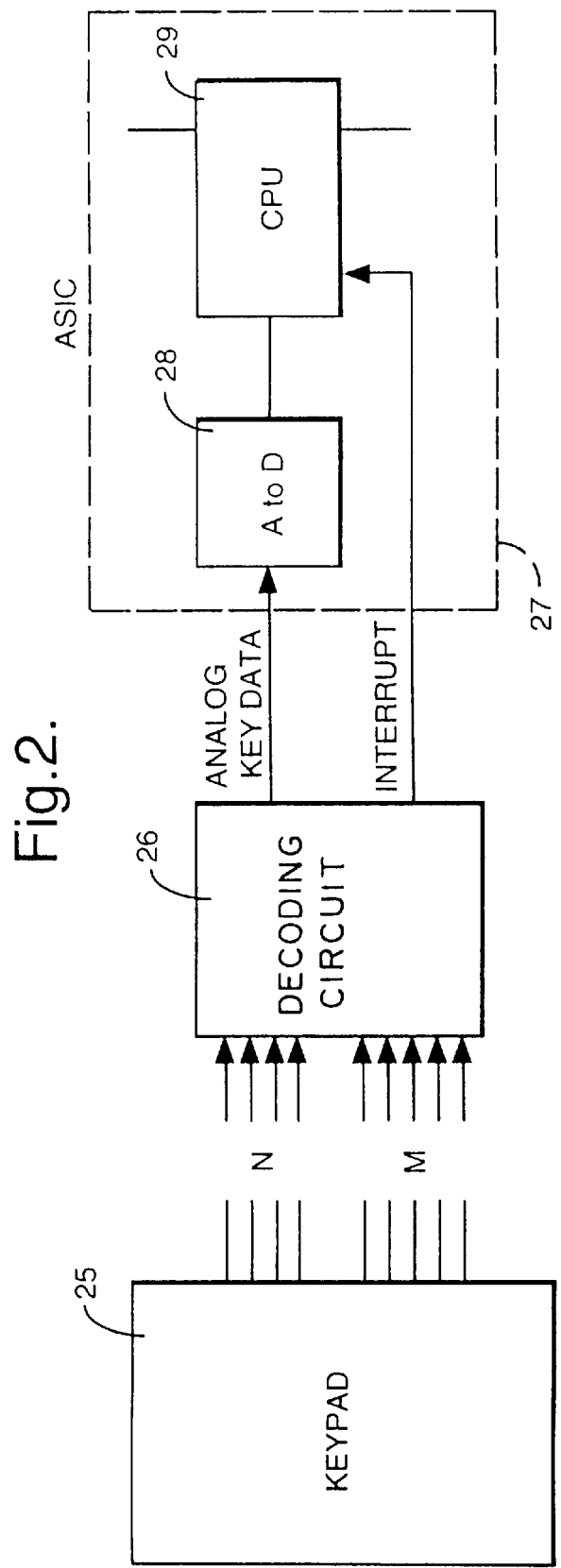
FIG. 2 shows a schematic representation of a first embodiment with components within a telephone housing of the type shown in FIG. 1, including a keypad and an application specific integrated circuit.

A schematic representation of internal operations of a first embodiment of a telephone, of the type shown in FIG. 1, is illustrated in FIG. 2. A keypad 25 includes a matrix of M rows and N columns, forming M×N cross point switch. When a key is pressed by an operator, one of the column lines (one from M) is connected to one of said row lines (one from N). Thus, N+M lines are supplied to a decoding circuit 26.

The decoding circuit 26 provides an analogue signal to an application specific integrated circuit 27, the voltage of which represents the particular key selected by an operator. In addition, an interrupt signal is supplied to said ASIC 27.

An analogue to digital converter, used primarily in converting analogue speech signals into digital code for transmission purposes is built into the ASIC 27 although it could be present on a discrete MCU. This analogue-to-digital converter is also used to convert the analogue signal received from circuit 26 into a digital code which is supplied to a central processing unit 29; which is possible because the converter is not required for speech during signalling operations. Central processing unit 29 also receives the interrupt signal from the circuit 26 although this could be generated by the ASIC itself with the advantage that only one analogue signal would be needed to connect the keypad circuit and the ASIC 27. Upon receiving an interrupt signal from circuit 26, the CPU 29 executes program instructions so as to re-configure the operation of analogue-to-digital converter 28 for the purpose shown in FIG. 2 and to process digital signals received from said analogue-to-digital converter 28.

Figure 3:
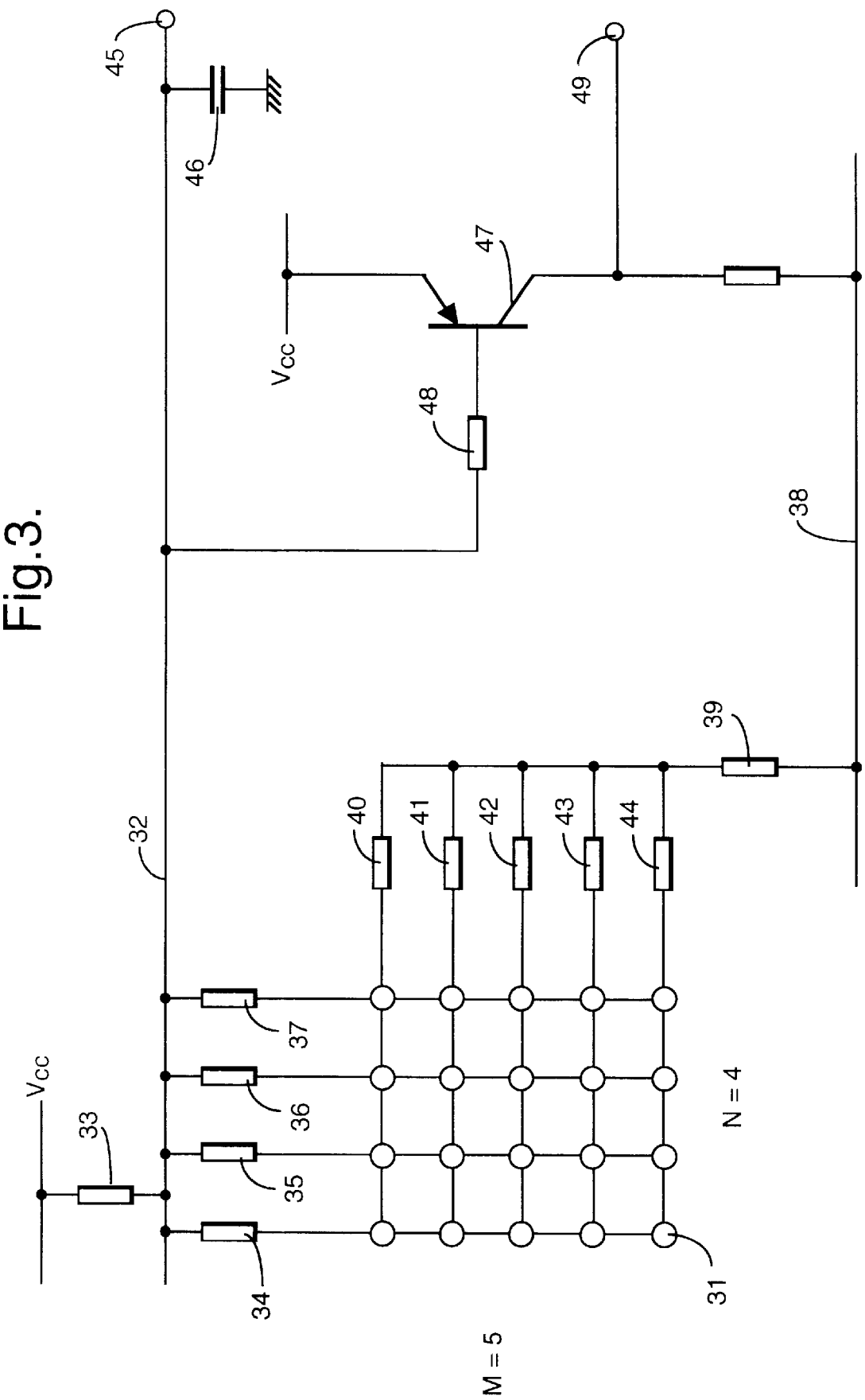
FIG. 3 details the keypad shown in FIG. 2.

Keypad 25 and its associated decoding circuit 26 are detailed in FIG. 3. Nodes 31 are cross points of a conventional cross point switch. Thus, a key, such as a key 20 shown in FIG. 1, is located above each of said cross points 31 and manual operation of said key results in the associated cross point making electrical contact.

Twenty cross points are provided in an array of five rows and four columns. Thus M, identifying the number of rows, equals five and N, identifying the number of columns, equals four. Columns will be numbered from left to right and rows will be numbered from top to bottom.

A supply voltage (VCC) is provided of typically +5 V or +3.3 V. An output line 32 is connected to VCC via a head resistor 33 of 36K ohm. A first column of switch points 31 is connected to the output rail 32 by a first column resistor 34 of 22K ohm. Similarly, a second column resistor connects the second column of switch points to the output rail 32 via a second column resistor 35 of 20K ohm.

A third column resistor 36 of 16K ohm connects the third column of cross points to the output rail 32 and the fourth column of cross points 31 are connected to the output rail via a fourth column resistor 37 of 11K ohm.

Each row of cross points is connected to a ground rail 38 via a tail resistor 39 of 16K ohms in series with respective row resistors for each of said rows. A first row cross points 31 is connected in series with a first row resistor 40 of 3K ohm and a second row of cross points is connected in series with a second row resistor of 41 of 3K ohm. A third row of cross points 31 are connected in series with a third row resistor 32 of 2K4 ohm, a fourth row of cross points are connected in series with a fourth row resistor 43 of 1K6 ohm and a fifth row of cross points are connected in series with a fifth row resistor 44 of 1K3 ohm. The specific resistor values provide a 1% tolerance, other values of resistors could, however, be used.

When no key is being pressed, no current is drawn by the keypad and the maximum current flow for any particular key depression should not exceed 80 micro amp.

The voltage appearing at output node 45, supplied to analogue-to-digital converter 28 as shown in FIG. 2, will depend upon the actual key pressed. The analogue-to-digital converter 28 provides a 10 bit output and valid key depressions are identified within the range 470 to 532, providing a total of 24 distinct key numbers. If two keys are pressed, effectively providing two current paths through the matrix, the voltage on line 32 drops below its valid region, producing an output from analogue-to-digital converter 28 with a value less than 400.

Operation outside idealised conditions will also occur due to temperature drift and non-optimum component values, therefore the system is robust enough to withstand shifts of up to 5 bits on the output of the analogue-to-digital converter.

A capacitor 46 is provided across the output 45 in order to filter out pickup from stray radio signals.

The voltage present on output line 32 is also supplied to the base of a PNP transistor 47, type XYZ, via a resistor 48 of a XYZ ohm. The collector of resistor 47 provides an interrupt output 49, such that depression of a key, resulting in a cross point 31 being activated, results in an interrupt output 49 being placed into a high condition, thereby supplying an interrupt to CPU 29.

In the first embodiment the characteristic which provides information to the processor identifying a specific key depression is effectively the resistance through the cross point switch. In the second embodiment, a charge is accumulated on a capacitor and a signal is generated by allowing said charge to discharge through the signal line. The rate of discharge identifies the particular key activated and this rate can be determined by measuring the duration over which the signal remains on a predetermined side of a predetermined threshold.

In the second embodiment a capacitor 51 holds charge and manual selection, in the form of a key depression, results in said capacitor discharging through a key-specific resistance. In its non-active state, capacitor 55 receives charges from the supply line 52. The capacitor 51 is connected in parallel with the resistor 53. This serves to pull the line up to the line voltage when a depressed key is released. The parallel connection is in turn connected in series with a plurality of resistor chains.

Figure 4:
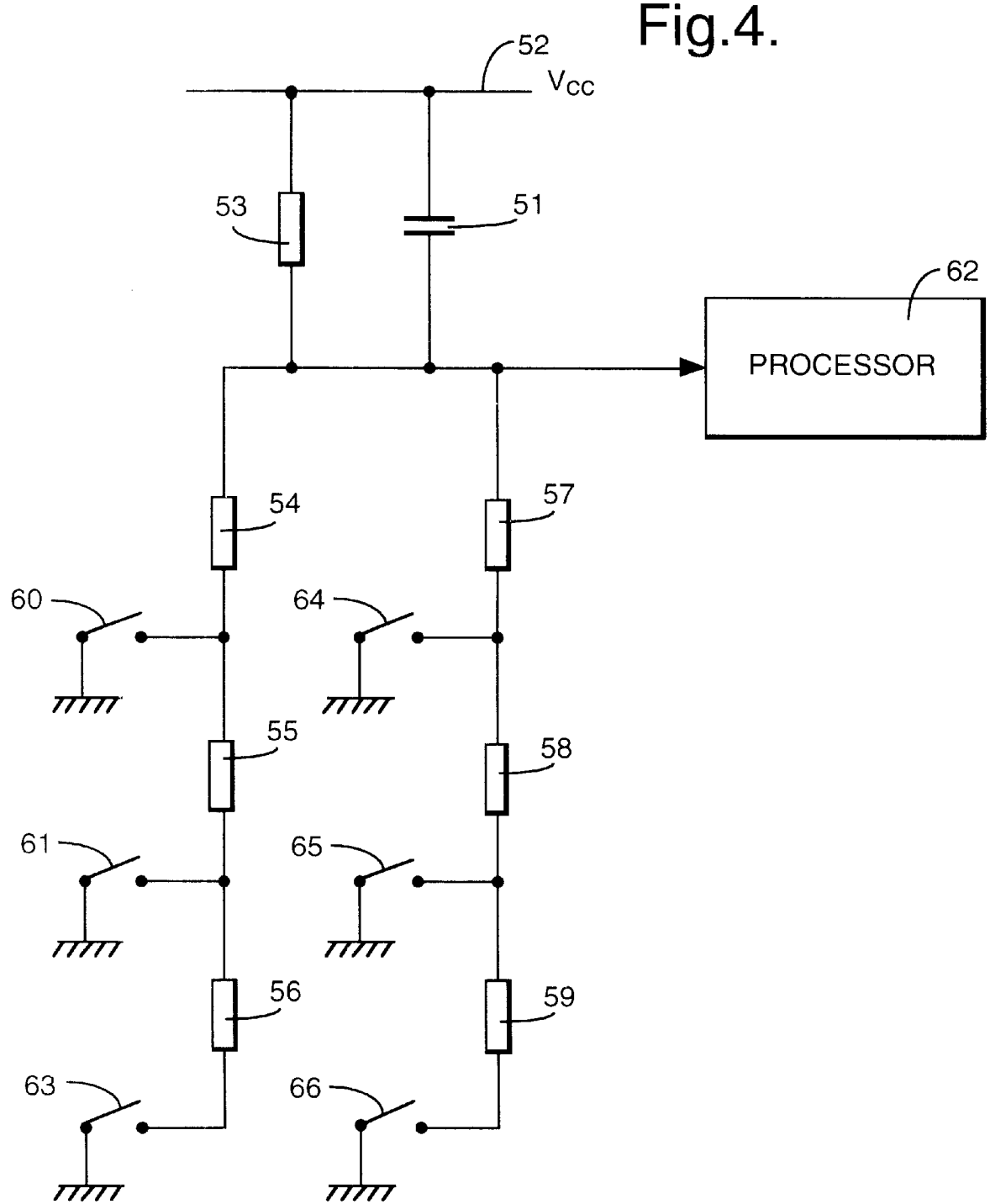
FIG. 4 shows a schematic representation of a second embodiment, including a keypad and an application specific integrated circuit.
Figure 5:
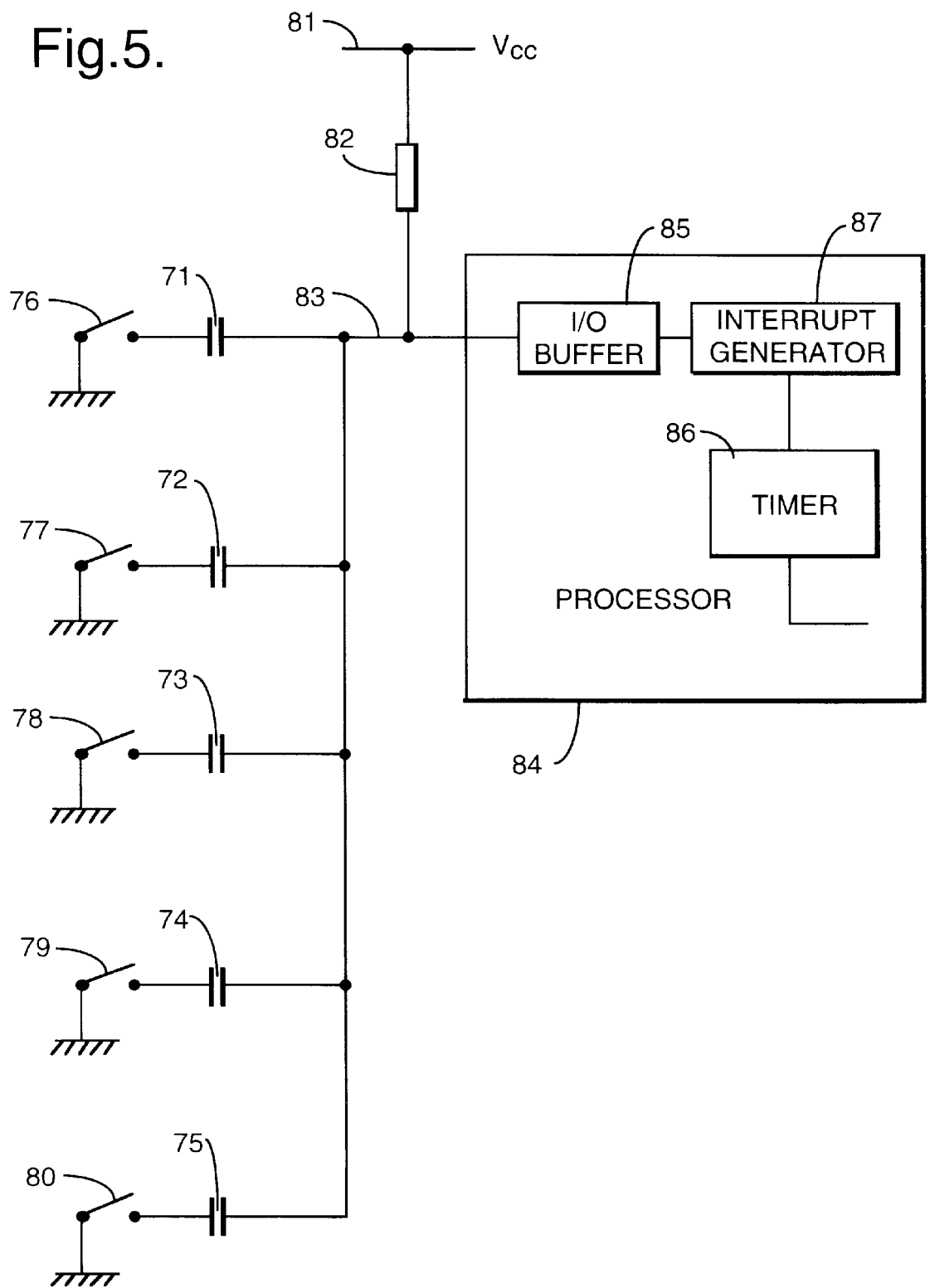
FIG. 5 details a keypad shown in FIG. 4.

In the example shown in FIG. 4, two chains are provided, each having three switches thereon, although it should be appreciated that more chains may be included and more switches may be included on each chain.

A first chain includes a resistor 54 connected in series with a resistor 55 which is in turn connected in series with a resistor 56. This chain is in parallel with a second chain consisting of a resistor 57 in series with a resistor 58, in series with a resistor 59.

When a first key 60 is depressed, the junction between resistor 54 and 55 is effectively grounded, thereby causing capacitor 51 to discharge through resistor 54. Thus, the rate of discharge is dependent upon the value of resistor 54. The rate of discharge is determined by measuring the period of time for a digital I/O buffer in the processor which is triggered by a falling edge when the signal reaches a predetermined level to be triggered.

Depression of key 61 results in capacitor 51 discharging through the serial connection of resistors 54 and 55, therefore the rate of discharge will be slower and a longer period of time will be measured by a processor 62. Similarly, activation of switch 63 results in capacitor 54 discharging through the series combination of resistors 54, 55 and 56.

It will be appreciated that the operation of switches 64, 65 and 66 occurs in a substantially similar manner. However, different resistance values are selected for this chain, so that the actual key depressed may be determined by the processor 62.

In the second embodiment a common capacitor 51 was provided and the rate at which this capacitor discharged varied in dependence upon serially connected resistance. In the third embodiment, this situation is reversed by providing capacitors 71, 72, 73, 74 and 75 each in series with respective switches 76, 77, 78, 79 and 80. Each of these capacitors receive charging current from a supply line 81 via a charging resistor 82. However, this charging current can only flow into a capacitor when its associated switch has been activated. Thus, for example, on activation of switch 76, capacitor 71 will charge up via resistor 82 and the total charge held by capacitor 71 will depend upon the capacitance of this device. Thus, the voltage on a signal line 83 will steadily increase until it reaches that of the supply voltage on line 81. However, the rate at which signal line 83 reaches the supply voltage 81 is inversely related to the capacitance of the capacitor being charged.

The signal on line 83 is supplied to a processor 84, substantially similar to processor 62 shown in FIG. 4. The signal line is supplied to a digital I/O buffer 85, within the processor 84, which is triggered by a rising edge when the signal reaches a predetermined level. An output from the buffer 85 is supplied to a timer 86, which determines the period prior to the I/O buffer being triggered. An interrupt generator 87 provides an indication that a key has been pressed for analysis to start. This provides a power saving advantage as the input port need not be continually poled to determine if a key has been pressed.

In both the second and third embodiments the charging or discharging process can be repeated, perhaps three to four times, to provide a check. Each time the process is repeated the digital I/O buffer is set to "output" to return the voltage to its previous setting and then reset to "input" to charge/discharge again. The subsequent durations determined can be compared with those previously determined and a more accurate key determination made.

The present invention includes any novel feature or combination of features disclosed herein either explicitly or any generalisation thereof irrespective of whether or not it relates to the claimed invention or mitigates any or all of the problems addressed.

In view of the foregoing description it will be evident to a person skilled in the art that various modifications may be made within the scope of the invention. In particular features of the processor 84 may be included in the embodiment of FIG. 2.

What is claimed is:

1. A radio telephone comprising:
   an array of manually operable selection means;
   means for supporting said manually operable selection means including electrical connection means arranged to make electrical contact when respective selection means are selected;
   processing means;
   a transmission line connecting said electrical connection means to said processing means;
   wherein said processing means is arranged to determine an analogue characteristic on a signal received from said connection means via said transmission line in order to determine which of said manually operable selection means has been manually operated;
   wherein said processing means is arranged to determine characteristics representing a valid operation and characteristics representing an invalid multiple operation.

2. A telephone according to claim 1, wherein a valid operation results in said characteristic being present within a first range while invalid characteristic values are outside said first range.

3. A telephone according to claim 1, wherein invalid characteristic values are inter-digitated between valid values.

4. A telephone according to claim 1, wherein signal power is not supplied to the processing means when selection means are not being manually operated.

5. A telephone according to claim 1, wherein said manually operable selection means are buttons extending from a face of said telephone, wherein said buttons are selected by manual depression thereof.

6. A radio telephone as in claim 1 where said processing means is arranged to determine as the invalid multiple operation when two keys of said manually operable selection means are depressed at the same time.

7. A radio telephone as in claim 6 wherein said characteristics representing an invalid multiple operation comprises a voltage drop in the signal below a valid region.

8. A radio telephone comprising:
   an array of manually operable selection means;
   means for supporting said manually operable selection means including electrical connection means arranged to make electrical contact when respective selection means are selected;
   processing means;
   wherein said processing means is arranged to determine an analogue characteristic on a signal received from said connection means via said transmission line in order to determine which of said manually operable selection means has been manually operated;
   wherein said means for supporting said selection means is a matrix of cross points having row terminals and column terminals;
   each of said row terminals is connected to a respective row impedance;
   each of said column terminals is connected to a respective column impedance; and
   said characteristic is the combined impedance of a specific row impedance and a specific column impedance.

9. A telephone according to claim 8, wherein said impedances are resistances.

10. A telephone according to claim 8, wherein said processor measures a signal value indicative of current flow through said combined impedances.

11. A telephone according to claim 10, wherein said processor determines a current value by measuring a voltage drop.

12. A telephone according to claim 8, wherein said processor converts analogue characteristic values into digital values via an analogue-to-digital converter.

13. A telephone according to claim 12, wherein said analogue-to-digital converter is also used to convert analogue speech signals into digital signals while the telephone is being used.

14. A telephone according to claim 12, wherein the definition of said analogue-to-digital converter is sufficient to provide tolerance bands so as to accommodate component tolerances.

15. A radio telephone comprising:

an array of manually operable selection means;

means for supporting said manually operable selection means including electrical connection means arranged to make electrical contact when respective selection means are selected;

processing means;

a transmission line connecting said electrical connection means to said processing means; wherein said processing means is arranged to determine an analogue characteristic on a signal received from said connection means via said transmission line in order to determine which of said manually operable selection means has been manually operated;

wherein said analogue characteristic is a duration over which a signal remains on a predetermined side of a predetermined threshold.

16. A telephone according to claim 15, wherein the level of said signal is modified after manual selection by capacitive charge movements.

17. A telephone according to claim 16, wherein charge stored capacitively discharges when a key is pressed.

18. A telephone according to claim 17, wherein said discharge occurs through a particular resistance value, thereby identifying the particular key depression, in terms of the rate of discharge.

19. A telephone according to claim 18, wherein each selection means has a specific capacitance associated therewith.

20. A telephone according to claim 16, wherein capacitance is charged when a key is pressed.

* * * * *